United States Patent
Tuers et al.

(10) Patent No.: US 9,455,038 B2
(45) Date of Patent: Sep. 27, 2016

(54) STORAGE MODULE AND METHOD FOR USING HEALING EFFECTS OF A QUARANTINE PROCESS

(71) Applicant: SanDisk Technologies Inc., Plano, TX (US)

(72) Inventors: Daniel E. Tuers, Kapaa, HI (US); Dana Lee, Saratoga, CA (US); Henry Chin, Milpitas, CA (US); Abhijeet Manohar, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/510,945

(22) Filed: Oct. 9, 2014

(65) Prior Publication Data

US 2016/0055910 A1 Feb. 25, 2016

(30) Foreign Application Priority Data

Aug. 20, 2014 (IN) .......................... 4060/CHE/2014

(51) Int. Cl.
| | |
|---|---|
| G11C 27/00 | (2006.01) |
| G11C 16/04 | (2006.01) |
| G11C 11/56 | (2006.01) |
| G11C 29/44 | (2006.01) |
| G11C 16/34 | (2006.01) |

(52) U.S. Cl.
CPC ....... *G11C 16/0466* (2013.01); *G11C 11/5671* (2013.01); *G11C 16/3404* (2013.01); *G11C 16/349* (2013.01); *G11C 16/3418* (2013.01); *G11C 29/4401* (2013.01)

(58) Field of Classification Search
CPC .......... G11C 16/0466; G11C 11/5671; G11C 16/23; G11C 29/4401; G11F 11/023; G06F 11/076; G06F 11/0793

USPC ..................................................... 365/185.03
See application file for complete search history.

(56) References Cited

U.S. PATENT DOCUMENTS

| | | | |
|---|---|---|---|
| 7,821,828 B2 | 10/2010 | Song et al. | |
| 8,009,482 B2 | 8/2011 | Wu et al. | |
| 8,248,831 B2 * | 8/2012 | Rotbard | G11C 11/56 365/185.03 |
| 8,374,014 B2 * | 2/2013 | Rotbard | G11C 11/56 365/185.18 |
| 8,599,592 B2 * | 12/2013 | Rotbard | G11C 11/56 365/185.03 |
| 2010/0165689 A1 * | 7/2010 | Rotbard | G11C 11/56 365/45 |
| 2010/0230807 A1 | 9/2010 | Bronner et al. | |

(Continued)

OTHER PUBLICATIONS

International Search Report and Written Opinion for PCT/US2015/036351 dated Aug. 28, 2015, 10 pages.

(Continued)

*Primary Examiner* — Richard Elms
*Assistant Examiner* — Xiaochun L Chen
(74) *Attorney, Agent, or Firm* — Brinks Gilson & Lione (57) ABSTRACT

A storage module and method are provided for using healing effects of a quarantine process. In one embodiment, a storage module is provided comprising a controller and a memory. The controller is configured to identify a set of memory cells in the memory that contains a bit error rate above a threshold, wherein the bit error rate is above the threshold due to trapped charge in dielectrics of the memory cells. The controller is also configured to quarantine the set of memory cells for a period of time, wherein while the set of memory cells is quarantined, heat generated by the storage module anneals the set of memory cells to at least partially remove the trapped charge.

33 Claims, 8 Drawing Sheets

(56) References Cited

U.S. PATENT DOCUMENTS

| | | | | |
|---|---|---|---|---|
| 2012/0044762 A1* | 2/2012 | Rotbard | ............ | G11C 11/56 |
| | | | | 365/185.03 |
| 2012/0201080 A1* | 8/2012 | Kang | ............ | G11C 16/0483 |
| | | | | 365/185.11 |
| 2012/0287692 A1* | 11/2012 | Rotbard | ............ | G11C 11/56 |
| | | | | 365/45 |
| 2013/0308390 A1* | 11/2013 | Lee | ............ | G11C 16/3481 |
| | | | | 365/185.22 |
| 2015/0138890 A1* | 5/2015 | Kang | ............ | G11C 16/0483 |
| | | | | 365/185.11 |

OTHER PUBLICATIONS

Lue et al., Radically Extending the Cycling Endurance of Flash Memory (to > 100M Cycles) by Using Built-in Thermal Annealing to Self-Fleal the Stress-induced Damage, Macronix International Co., Ltd., pp. 9.1.1-9.1.4., 2012 IEEE.

* cited by examiner

STORAGE MODULE AND METHOD FOR USING HEALING EFFECTS OF A QUARANTINE PROCESS

PRIORITY

This application claims priority to India Patent Application No. 4060/CHE/2014, filed on Aug. 20, 2014, entitled "Storage Module and Method for Using Healing Effects of a Quarantine Process," the entire disclosure of which is hereby incorporated by reference.

BACKGROUND

Charge trapped in a dielectric of a memory cell can reduce the ability of the memory cell to retain data, as the trapped charge makes it difficult or impossible to read the true value of the data stored in the memory cell. Some storage modules try to manage this problem by limiting the number of program-erase cycles. However, this may overly limit the use of use of the memory. Other storage modules try to manage this problem by lowering read scrub error thresholds, shifting read thresholds, or performing dynamic read or CVD tracking in order to track distributions as both lower and upper tails shift down. However, while these techniques may be helpful in reading the true value of data stored in a memory cell with trapped charge, the lower thresholds used by these techniques can introduce errors in reading memory cells that do not have trapped charge.

Overview

Embodiments of the present invention are defined by the claims, and nothing in this section should be taken as a limitation on those claims.

By way of introduction, the below embodiments relate to a storage module and method for using healing effects of a quarantine process. In one embodiment, a storage module is provided comprising a controller and a memory. The controller is configured to identify a set of memory cells in the memory that contains a bit error rate above a threshold, wherein the bit error rate is above the threshold due to trapped charge in dielectrics of the memory cells. The controller is also configured to quarantine the set of memory cells for a period of time, wherein while the set of memory cells is quarantined, heat generated by the storage module anneals the set of memory cells to at least partially remove the trapped charge.

Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

As mentioned in the background section above, charge trapped in a dielectric of a memory cell can reduce the ability of the memory cell to retain data. The following embodiments provide a storage module that uses the healing effects of a quarantine process in order to free the trapped charge to improve endurance and reduce the number of flipped bit counts (FBCs) performed by the storage module. In general, quarantining memory cells for a period of time can increase the memory cell's data retention characteristics by naturally annealing the memory cells, so they expel charge trapped in their dielectrics. Before turning to these and other embodiments, the following paragraphs provide a discussion of exemplary storage modules that can be used with these embodiments. Of course, these are just examples, and other suitable types of storage modules can be used.

Figure 1:
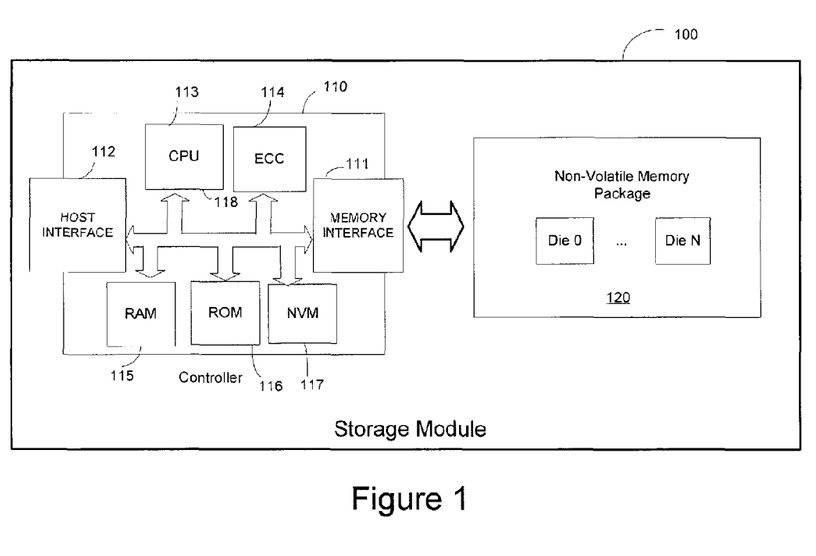
FIG. 1 is a block diagram of an exemplary storage module of an embodiment.

As illustrated in FIG. 1, a storage module 100 of one embodiment comprises a storage controller 110 and a non-volatile memory package 120 containing a plurality of memory dies (Die 0 to Die N). Although only one non-volatile memory package is shown in FIG. 1, it should be understood that the storage module 100 can have more than one non-volatile memory package. The storage controller 110 comprises a memory interface 111 for interfacing with the non-volatile memory package 120 and a host interface 112 for placing the storage module 100 operatively in communication with a host controller. As used herein, the phrase "operatively in communication with" could mean directly in communication with or indirectly in (wired or wireless) communication with through one or more components, which may or may not be shown or described herein.

Figure 2A:
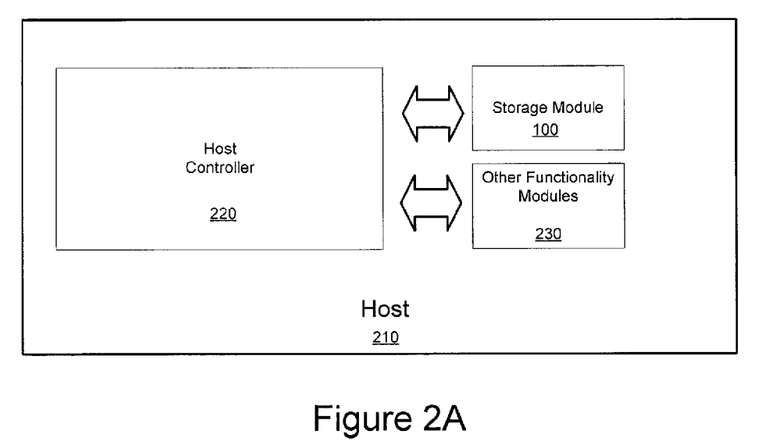
FIG. 2A is a block diagram of a host of an embodiment, where the exemplary storage module of FIG. 1 is embedded in the host.

As shown in FIG. 2A, the storage module 100 can be embedded in a host 210 having a host controller 220. That is, the host 210 embodies the host controller 220 and the storage module 100, such that the host controller 220 interfaces with the embedded storage module 100 to manage its operations. For example, the storage module 100 can take the form of an iNAND™ eSD/eMMC embedded flash drive by SanDisk Corporation, storage devices that use NVMe, SAS and SATA host interfaces, or, more generally, any type of solid state drive (SSD) (e.g., an enterprise solid-state storage device), a hybrid storage device (having both a hard disk drive and a solid state drive), and a memory caching system. The host controller 220 can interface with the embedded storage module 100 using, for example, an eMMC host interface or a UFS interface. The host 210 can take any form, such as, but not limited to, a mobile phone, a tablet computer, a digital media player, a game device, a personal digital assistant (PDA), a mobile (e.g., notebook, laptop) personal computer (PC), or a book reader. As shown in FIG. 2A, the host 210 can include optional other functionality modules 230. For example, if the host 210 is a mobile phone, the other functionality modules 230 can include hardware and/or software components to make and place telephone calls. As another example, if the host 210 has network connectivity capabilities, the other functionality modules 230 can include a network interface. Of course, these are just some examples, and other implementations can be used. Also, the host 210 can include other components (e.g., an audio output, input-output ports, etc.) that are not shown in FIG. 2A to simplify the drawing. It should be noted that while the host controller 220 can control the storage module 100, the storage module 100 can have its own controller to control its internal memory operations. Also, in general, a host controller can be any controller capable of interfacing with the storage module, be it a controller in monolithic form, an entire controller, or a separate functionality module.

Figure 2B:
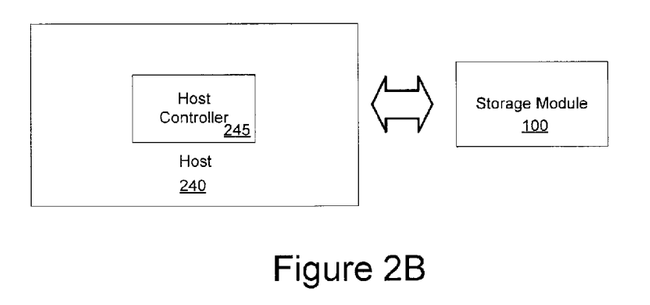
FIG. 2B is a block diagram of the exemplary storage module of FIG. 1 removably connected to a host, where the storage module and host are separable, removable devices.

As shown in FIG. 2B, instead of being an embedded device in a host, the storage module 100 can have physical and electrical connectors that allow the storage module 100 to be removably connected to a host 240 (having a host controller 245) via mating connectors. As such, the storage module 100 is a separate device from (and is not embedded in) the host 240. In this example, the storage module 100 can be a handheld, removable memory device, such as a Secure Digital (SD) memory card, a microSD memory card, a Compact Flash (CF) memory card, a universal serial bus (USB) device (with a USB interface to the host), or a solid-state drive (SSD), and the host 240 is a separate device, such as a mobile phone, a tablet computer, a digital media player, a game device, a personal digital assistant (PDA), a mobile (e.g., notebook, laptop) personal computer (PC), or a book reader, for example.

In FIGS. 2A and 2B, the storage module 100 is in communication with a host controller 220 or host 240 via the host interface 112 shown in FIG. 1. The host interface 112 can take any suitable form, such as, but not limited to, an eMMC host interface, a UFS interface, and a USB interface. The host interface 110 in the storage module 110 conveys memory management commands from the host controller 220 (FIG. 2A) or host 240 (FIG. 2B) to the storage controller 110, and also conveys memory responses from the storage controller 110 to the host controller 220 (FIG. 2A) or host 240 (FIG. 2B). Also, it should be noted that when the storage module 110 is embedded in the host 210, some or all of the functions described herein as being performed by the storage controller 110 in the storage module 100 can instead be performed by the host controller 220.

Returning to FIG. 1, the storage controller 110 comprises a central processing unit (CPU) 113, an error correction code (ECC) module 114 operative to encode and/or decode an ECC code word with data and syndrome bits, read access memory (RAM) 215, read only memory (ROM) 116 which can store firmware for the basic operations of the storage module 100, and a non-volatile memory (NVM) 117 which can store a device-specific key used for encryption/decryption operations, when used. The storage controller 110 can be implemented in any suitable manner. For example, the storage controller 110 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. Suitable controllers can be obtained from SanDisk or other vendors. The storage controller 110 can be configured with hardware and/or software to perform the various functions described below and shown in the flow charts. Also, some of the components shown as being internal to the storage controller 110 can also be stored external to the storage controller 110, and other component can be used. For example, the RAM 115 (or an additional RAM unit) can be located outside of the controller die and used as a page buffer for data read from and/or to be written to the memory package 120.

The memory dies in the non-volatile memory package 120 can also take any suitable form. For example, in one embodiment, one or more of the memory dies take the form of a solid-state (e.g., flash) memory and can be one-time programmable, few-time programmable, or many-time programmable. The memory dies can also use single-level cell (SLC), multiple-level cell (MLC), triple-level cell (TLC), or other memory technologies, now known or later developed. Also, the memory dies can be a two-dimensional memory or a three-dimensional memory.

Figure 3:
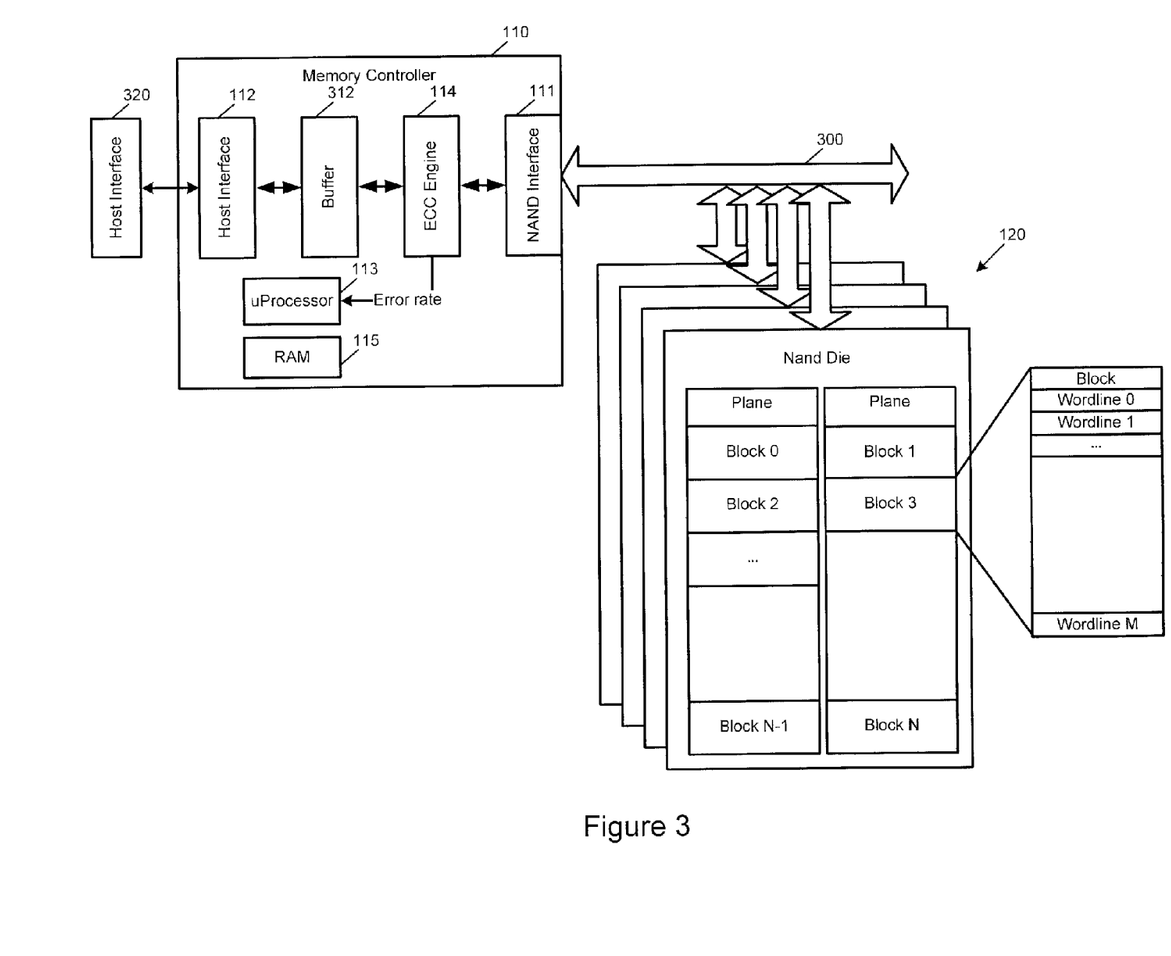
FIG. 3 is a block diagram of a controller and flash package of an embodiment.

Turning again to the drawings, FIG. 3 is a diagram of some of the components of the controller 110 and memory package 120 of one embodiment. This is merely an example, and other components can be used. As shown in FIG. 3, in this embodiment, the non-volatile memory package 120 takes the form of a Flash package with a plurality of Flash dies, where each Flash die has a plurality of planes, each with a plurality of blocks having a plurality of word lines. The memory interface 111 of the controller 110 takes the form of a NAND interface in this example, and the host interface 112 in the controller 110 communicates with a host interface 320 of a host. A Flash bus 300 connects the NAND interface 111 of the controller 110 with the memory package 120. The memory controller 110 also has a buffer 310 between the host interface 112 and the ECC engine 114. The ECC engine 114 can be implemented in any suitable way using any suitable error correction code technique. In this particular embodiment, the ECC engine 114 implements a low-density parity-check (LDPC). LDPC is an example of "soft-input ECC" in which probability information is provided to an ECC decoder with respect to data bits being decoded, and the ECC decoder uses the probability information to find the most-likely solution. Such soft-input decoding may be used in charge storage memory, for example, by using a high-resolution read to resolve not only the memory state of a particular memory cell but also the reliability of the read data. Reliability may be measured by different metrics, where one the commonly-used metrics is the Log Likelihood Ratio (LLR). In another embodiment, the ECC engine 114 implements a BCH code. Of course, these are merely examples, and other types of ECC techniques can be used.

As noted above, charge trapped in a dielectric of a memory cell can reduce the ability of the memory cell to retain data, as the trapped charge makes it difficult or impossible to read the true value of the data stored in the memory cell. Prior storage modules try to manage this problem by limiting the number of program-erase cycles or shifting read thresholds. However, these prior approaches either overly limit the use of use of the memory or can introduce errors in reading memory cells that do not have trapped charge.

To better address the trapped-charge problem and increase endurance and data retention, the following embodiments take advantage of the heat generated inside the storage module 100 during its normal operation to anneal a set of memory cells to at least partially remove the trapped charge. As used herein, a "set" can have one or more than one member, and annealing refers to a heat treatment process that alters the physical and/or chemical properties of a material to change its characteristics. In general, once memory cells exhibit poor data retention (e.g., as detected by a high bit-error rate), there is a high likelihood that the memory cells will perform in the same poor way if they are reprogrammed. However, test results show that if the memory cells are isolated for a period of time before being cycled (i.e., erased and programmed) again, they will exhibit better data retention characteristics. This isolation does not need to be done at every erase-program cycle but instead can be done periodically (e.g., after hundreds or thousands of cycles).

Figure 4:
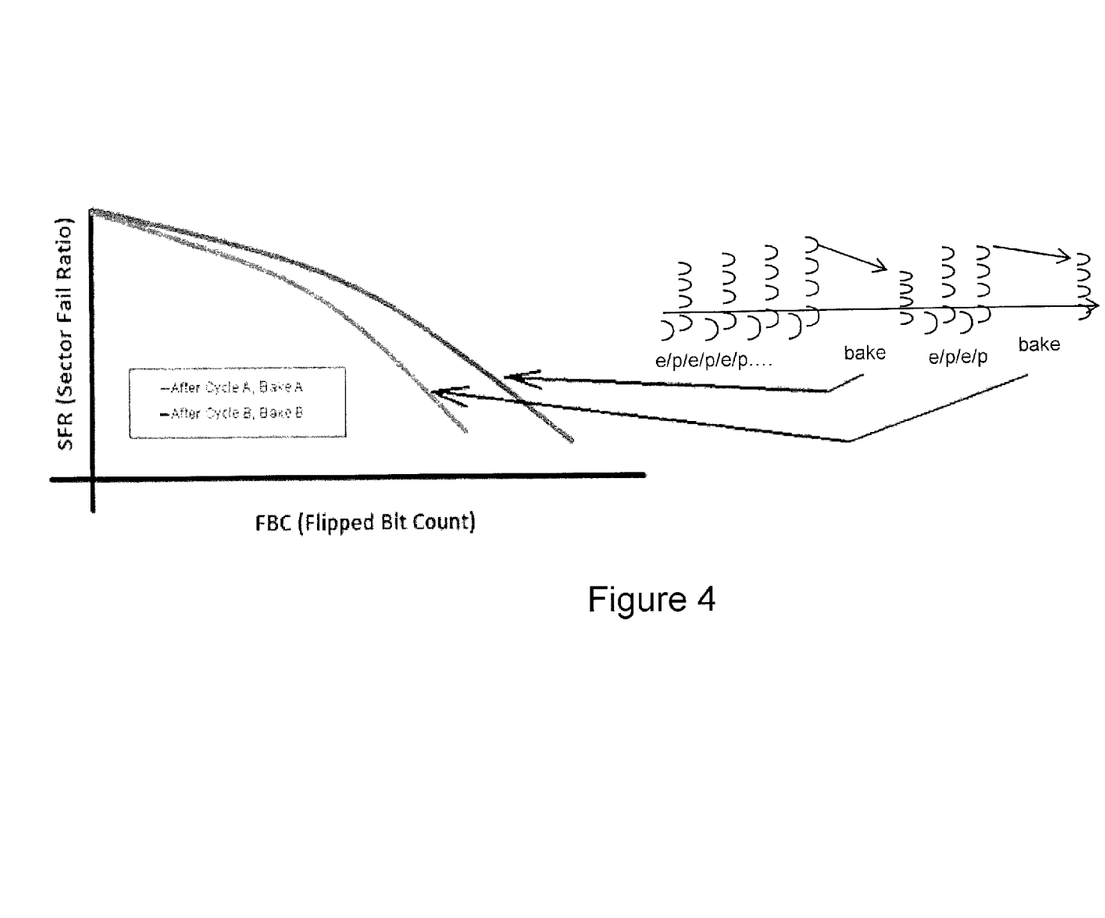
FIG. 4 is a diagram that illustrates the healing effects of a quarantine process of an embodiment.

FIG. 4 illustrates the healing effects of this quarantine process. As shown in the right-hand portion of FIG. 4, after several erase-program cycles, the memory cell becomes more difficult to read accurately because of the threshold drift caused by charged trapped in the memory cell. This can occur, for example, (a) when a small pool of single-level cells (SLC) are repeatedly used, (b) when the device is at capacity (or preconditioned), and the host writes a small region continuously, forcing a particular set of blocks to become hot, or (c) when a block or series of blocks begins to exhibit a higher BER. However, when the memory cell is "baked" (annealed), at least some of the trapped charged is removed, and the threshold drift is improved. The left-hand portion of FIG. 4 shows data collected from an experiment for the cell history shown in the right-hand portion of FIG. 4. This experiment assumes that the data retention characteristics are repeatable (or at least highly correlated). So, the memory cells that have a high bit-error rate (BER) after Bake A will be likely to have high BER after Bake B. The memory in this example is a 24 nm X2 memory cycled at 8 K. The test started with a relatively-large group of units that had been cycled and baked for data retention. After more cycles were added, data retention was retested. The conditions are in this specific example were as follows:

Cycle A: 8 k at 40° C., (with the last 3.2 k having ~800 sec relaxation)

Bake A: 12 hr at 85° C., then measure sector fail rate (SFR) vs. flipped bit count (FBC)/sector.

Cycle A and Bake A were already completed as part of the component qual.

Cycle B: 500 at 55° C. with ~200 sec relaxation.

Bake B: 12 hr at 85° C., then measure SFR vs. FBC/sector

Cycle B conditions were selected primarily for convenience, in order to complete the experiment in a reasonable amount of time and because 5% to 10% cycling is a reasonable amount of periodicity for DR correlation tests.

The experimental procedure effectively inserts a de-trapping bake (Bake A) between the 8 k (Cycle A) and 500 cycles (Cycle B). This bake serves to de-trap many of the electrons that were trapped during Cycle A. If these traps are not fully re-trapped during Cycle B, then the experiment realizes a benefit to high-temperature data retention (HTDR) behavior even without any correlation filtering. The plot in FIG. 4 shows the sector fail ratio after 8 k cycles and 85° C./12 hr bake, and then again after the subsequent 500 cycles and another 85° C./12 hr bake. The HTDR fail rate has improved even with the extra 500 cycles (8.5 k total), because Bake A was a long enough anneal. In practice, long annealing-bakes can require greater over-provisioning. Further, a shorter "Bake A" time may also provide a de-trapping benefit.

With the theory now explained, the following paragraphs describe how the storage module 100 can take advantage of these healing effects. In general, the controller 100 identifies a set of memory cells in the memory that contains a bit error rate above a threshold and then quarantines the set of memory cells for a period of time. As used herein, a set of memory cells is "quarantined" when it is left undisturbed (e.g., not programmed/erased and/or read) for a period of time. While the set of memory cells is quarantined, heat generated by the storage module 100 anneals the set of memory cells to at least partially remove the trapped charge in dielectrics of the memory cells. In one embodiment, the heat used in the annealing process is generated by the storage module 100 in its normal operation.

FIGS. 5-8 illustrate some exemplary embodiments of this technique and various implementations of the processes of detecting, tracking and isolating, re-testing, and cycling/rotating of memory cells. In these examples, the set of memory cells takes to form of a word line in a block of memory. In the example in FIGS. 5 and 6, only the bad word line in the block is quarantined, and at least some of the other word lines in the block are continued to be used for user data (i.e., the block is "idled"). In contrast, in the example in FIGS. 7 and 8, the entire block is quarantined (i.e., the block is "sidelined"). Of course, these are merely examples, and other implementations can be used.

Figure 5:
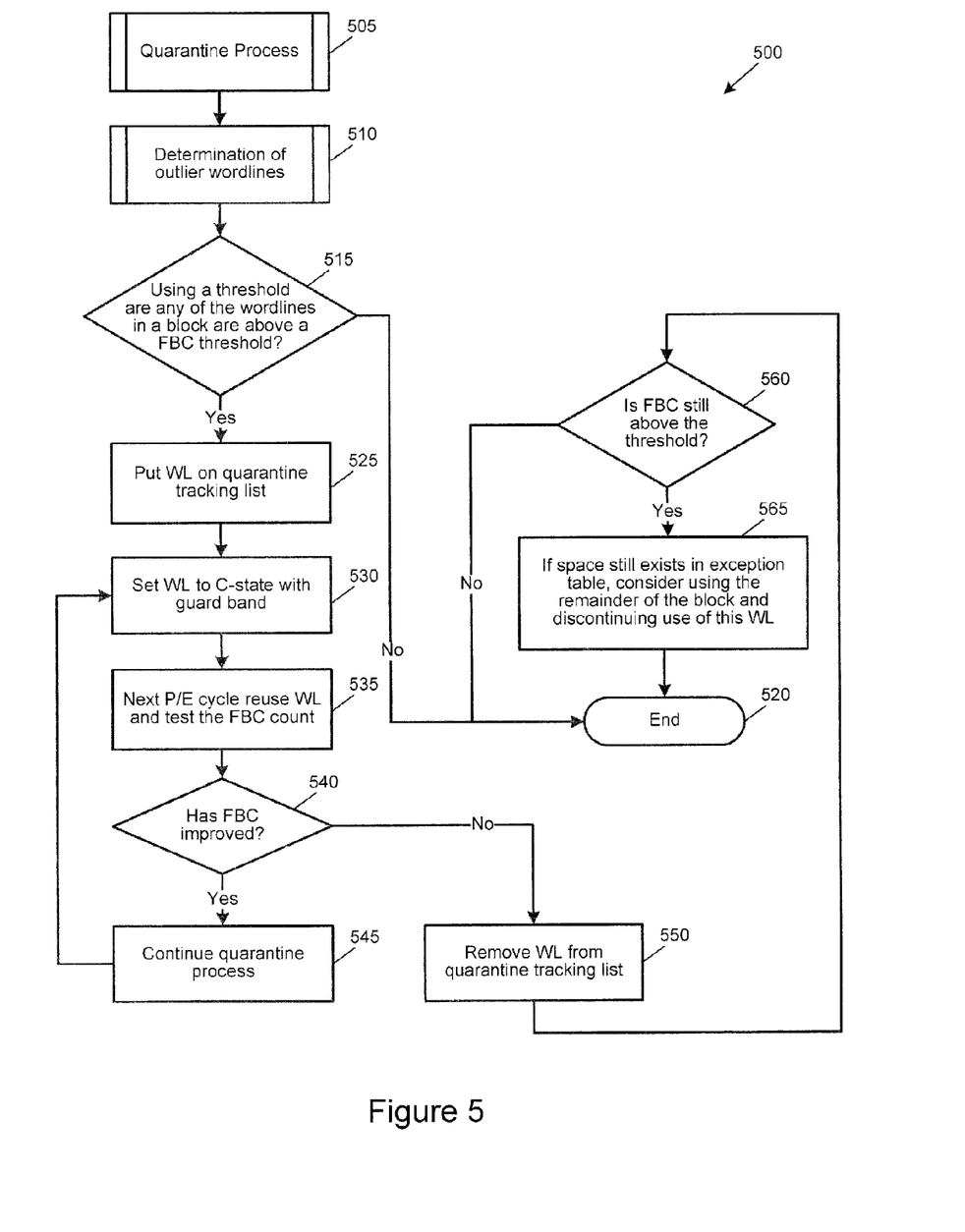
FIG. 5 is a flow chart of a method of an embodiment for quarantining word lines.
Figure 6:
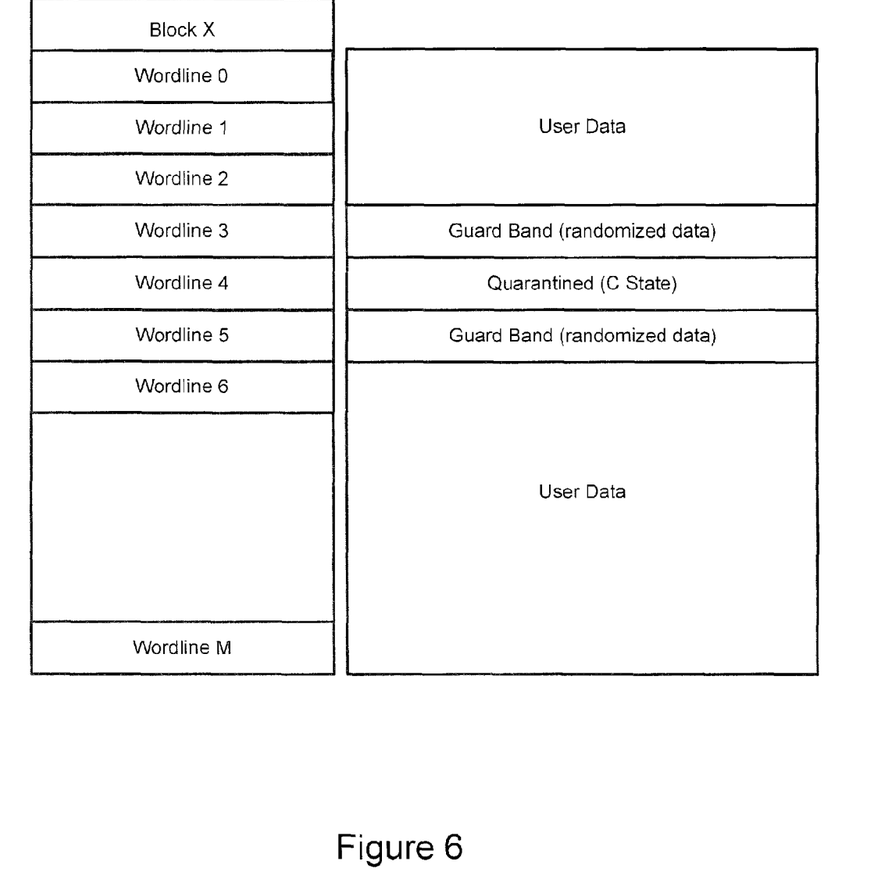
FIG. 6 is an illustration of a quarantined word line of an embodiment.

Turning first to FIG. 5, FIG. 5 is a flow chart 500 of a method of an embodiment for quarantining word lines. As shown in FIG. 5, after the quarantine process commences (act 505), the controller 110 makes a determination of outlier word lines (act 510). In general, a trapped charge problem is likely to be present when word lines exhibit substantially high BERs when compared to surrounding data (including other similarly-aged blocks). In this embodiment, the controller 110 uses a threshold to determine if any of the word lines in a block have a bit error rate (BER) (e.g., a flipped-bit count (FBC) rate) above a threshold (act 515). The threshold can be dynamically adjusted as the memory 120 wears. In one embodiment, the threshold is set high enough, so that, at any given time, only x % of the word lines (where is x is much less than the cycle group size) are selected for this special quarantine procedure, and only a subset of the group size is quarantined. The memory cells that are detected as good are placed back into the free pool. In other words, this particular embodiment only identifies a small portion of memory cells, memory cells being the worst cells, to go through this process. Another method for the detection of charge traps could be to test the BER immediately after programming and again compare the results with similarly-aged blocks. The correlation may be less meaningful without a data retention factor. The controller 110 then puts that word line on a quarantine tracking list (e.g., in RAM 115) (act 525). By being on the quarantine tracking list, the word line will not be disturbed for a period of time to allow annealing of the memory cells in the word line.

The annealing process may work better if the memory cells are programmed with data (in any state other than the erased state) before quarantining the memory cells. So, in one embodiment, the memory cells are programmed before being quarantined. While the memory cells can be programmed with user data, using normal user data may not be as effective on expelling the trapped charges as other methods to be described and can also complicate the firmware's data retention algorithm since it relies on putting valid data in memory cells that are known to have data retention issues. Also, if the memory cells store multiple bits per cell, the annealing process may work better if all of the bits of the memory cell in the targeted word line are placed in a "high" programmed state (such as the B or C state in X2 memory or the F or G state in X3 memory) (act 520).

In this embodiment, the other word lines in the block (i.e., the word lines in the block that do not have a high bit-error rate) can be used to store data. So, it is only the word line with the error problems that is quarantined—not the entire block. (Although, in another embodiment discussed below in conjunction with FIGS. 7 and 8, the entire block containing the word line is quarantined.) While the other word lines can be used to store user data, in one embodiment, one or more word lines surrounding the quarantined word line are programmed with dummy data (e.g., randomized data) as a guard band between the quarantined word line and user data to ensure no disturb effects occur between the programmed high state (such as B/C or F/G) and the user data (see FIG. 6). A table in firmware can be used to track these quarantined erased word lines to ensure that the word lines are not detected as write abort in the event of a boot scan or detected as an error during a scrub scan.

Returning to FIG. 5, during the next program/erase cycle, the controller 110 reuses the word line and tests the FBC count to determine if the FBC has improved (acts 535 and 540). If the FBC has improved, the quarantine process continues (act 545). If the FBC has not improved, the word line is removed from the quarantine tracking list (act 550), and the controller 110 determines if the FBC is still above the threshold (act 560). If it is and if space still exists in the exception table, the controller 100 can consider using the remainder of the block and discontinue use of the word line (act 565). In other words, the controller 110 can test the word line to see if there is an improvement in the bit error rate. If there is an improvement but the bit error rate is still not below the threshold, the controller 110 can continue the quarantine of the word line. If enough of an improvement is made, the quarantine can end entirely. However, if there is no improvement in the bit error rate, the controller 100 can permanently quarantine the word line (or a larger set of word lines or the block that contains the bad word line).

In the above example, only the bad word line in the block was quarantined, and at least some of the other word lines in the block were continued to be used to store user data. As mentioned above, in another embodiment, the entire block containing the word line is quarantined. This alternative will now be discussed in conjunction with FIGS. 7 and 8.

Figure 7:
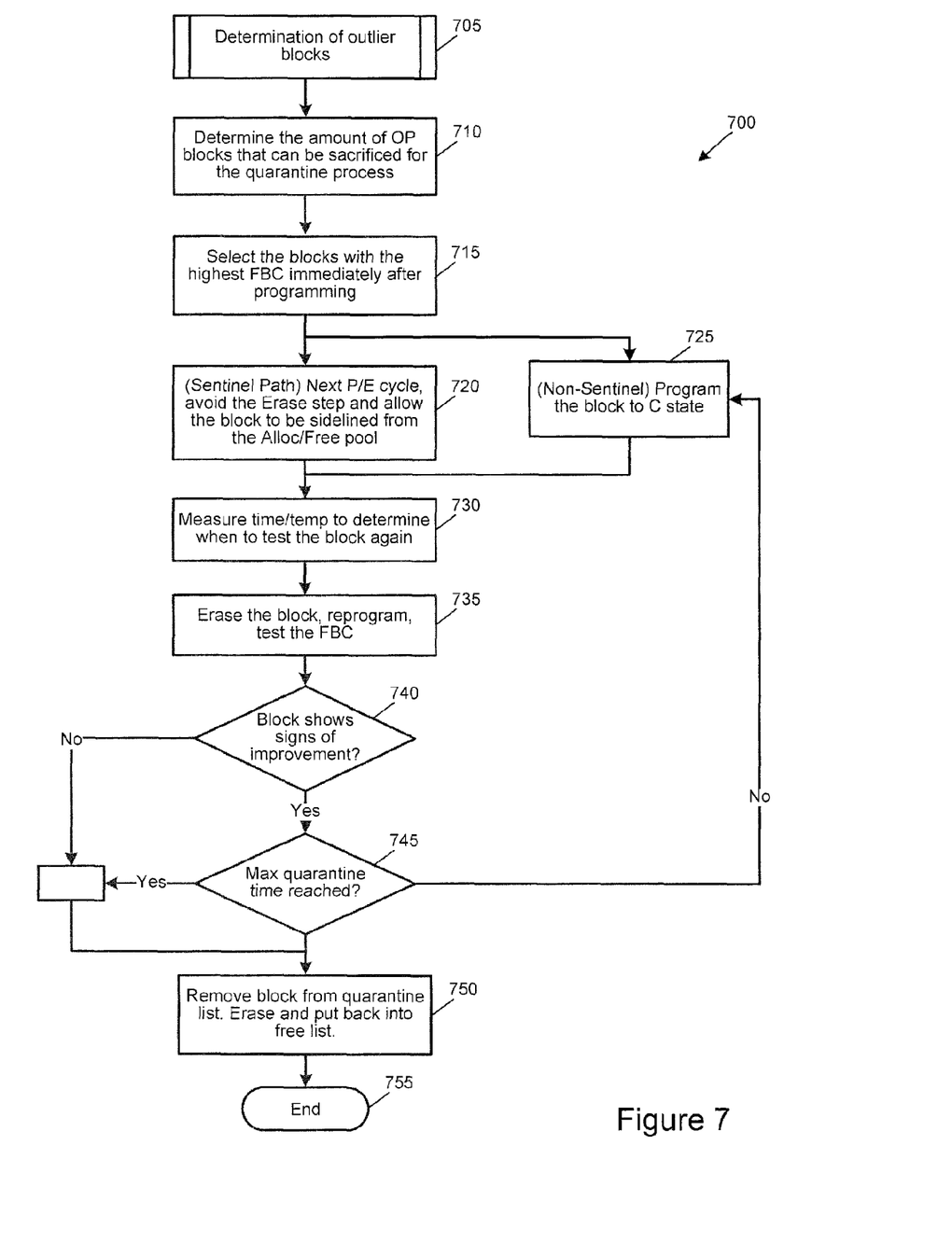
FIG. 7 is a flow chart of a method of an embodiment for quarantining blocks.

As shown in the flow chart 700 in FIG. 7, the controller 100 first makes a determination of outlier blocks (act 705). The controller 110 determines the amount of open (OP) blocks that can be sacrificed for the quarantine process (act 710). Since all blocks cannot go through the annealing process simultaneously in one embodiment, the entire capacity can be divided into small subgroups. These groups can be separated out at compaction time and then set aside for this process. The amount of time this process takes can be calculated by the following algorithm: Anneal Time= (Temp*−7)+610, where anneal time is in hours, and temp is in degrees Celsius. Cycling and rotating through groups can require some minimal amount of block overprovisioning.

The controller 110 then selects the blocks with the highest flipped bit count (FBC) immediately after programming (act 715). If a sentinel path technique is used, on the next program/erase cycle, the controller 110 avoids the erase step and allows the block to be sidelined from the allocated/free pool (act 720). Sentinel path techniques are discussed in more detail in "Temperature Accelerated Stress Time in a Memory Device," U.S. patent application Ser. No. 14/510, 771 (now U.S. Pat. No. 9,361,030), which is being filed on the same day herewith and is hereby incorporated by reference. If the sentinel path technique is not used, the controller 110 programs the block to a high voltage state, as discussed in the prior example above (act 725).

In either case, the controller 110 measures the time and temperature to determine when to test the block again (act 730). The period of time in which the set of memory cells is quarantined and annealed can be dependent on a temperature in the storage module 100. In general, the annealing process works better at higher temperatures. So, the higher the temperature in the storage module 100, the less time the set of memory cells needs to be quarantined. In one embodiment, the temperature in the storage module 100 is determined by a temperature sensor in the storage module 100, and the period of time in which the set of memory cells is quarantined is determined by a clock signal inside the controller 110. Alternatively, the temperature and time can be estimated using a sentinel cell's voltage drift, as described in "Temperature Accelerated Stress Time in a Memory Device," U.S. patent application Ser. No. 14/510, 771 (now U.S. Pat. No. 9,361,030), which is being filed on the same day herewith and is hereby incorporated by reference.

Figure 8:
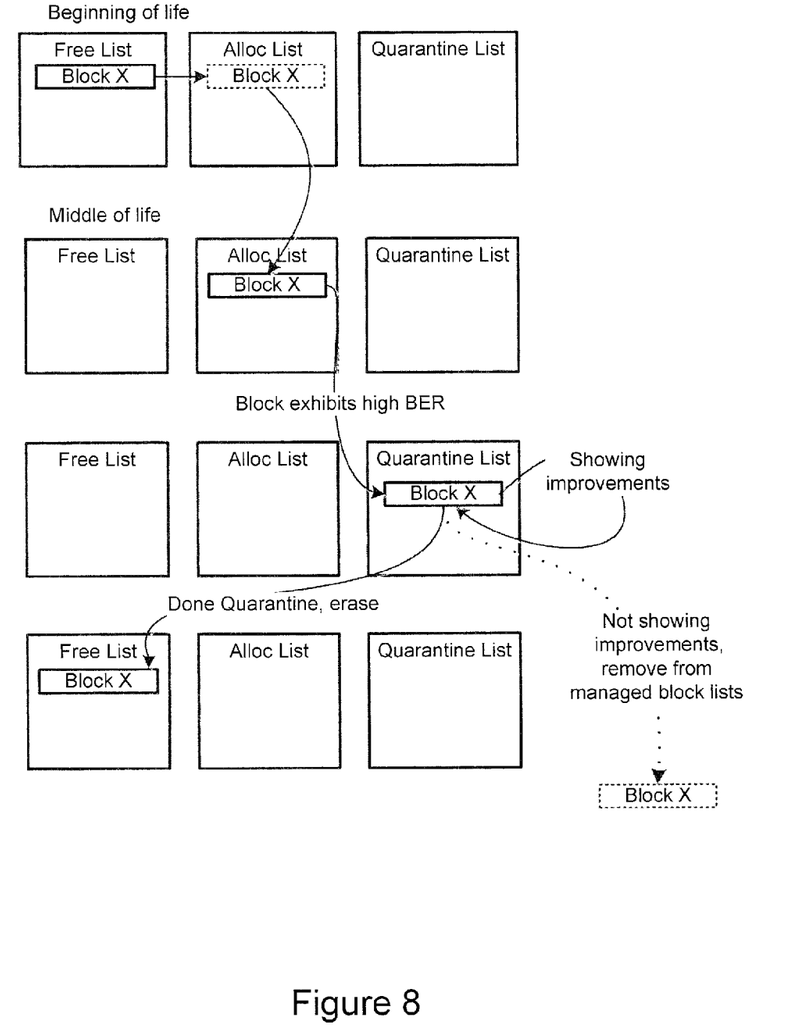
FIG. 8 is an illustration of a quarantined block of an embodiment.

Returning to FIG. 7, the controller 110 then erases the block, reprograms the block, and tests the FBC to see if the block shows signs of improvement (acts 735 and 740). If there has been no sign of improvement and if the maximum quarantine time has been reached (act 745), the controller 110 removes the block from the quarantine list, erases it, and puts it back into the free list (act 750). The process then ends (act 755). FIG. 8 shows this process of quarantining a block.

It should be noted that the above illustrations were merely examples, and other implementations can be used. For example, in one alternate embodiment, instead of completely taking the block out of commission, the controller 100 can slow circulation of the quarantined block to allow enough time for heat generated by the storage module 100 to anneal the memory cells and release the trapped charges, while maintaining the knowledge that the block is problematic. It should also be noted that, in one embodiment, when blocks are removed from circulation, only the physical blocks are removed from circulation—not the metablocks. The good blocks in the metablock can be relinked, thereby decreasing the amount of capacity that is isolated. This is referred to as "temporary physical block quarantine."

In yet another embodiment, instead of or in addition to using the heat generated by the storage module 100 in its normal operation for annealing, the storage module 100 can be provisioned with a heating module that provides additional heat. However, as this embodiment is not trying to heal physical damage in the memory cell but instead just de-trap charges, a high temperature is not needed, so a specific heating element is not required. The mere act of idling the memory cells is enough to provide a significant improvement.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:
1. A storage module comprising:
a memory; and
a controller in communication with the memory, wherein the controller is configured to:
identify a word line having a set of memory cells in the memory that contains a bit error rate above a thresh- old, wherein the bit error rate is above the threshold due to trapped charge in dielectrics of the memory cells;
program the word line; and
after the word line has been programmed, quarantine the word line for a period of time, wherein while the word line is quarantined, heat generated by the storage module anneals the set of memory cells to at least partially remove the trapped charge;
wherein the word line is one of a plurality of word lines in a block of memory, and wherein the controller is further configured to continue to use the other word lines in the block to store data while the word line is quarantined and to program dummy data in one or more word lines surrounding the quarantined word line.

2. The storage module of claim 1, wherein the word line is one of a plurality of word lines in a block of memory, and wherein the controller is further configured to slow a circulation of the block to allow enough time for heat generated by the storage module to anneal the set of memory cells to at least partially remove the trapped charge.

3. The storage module of claim 1, wherein the controller is further configured to test the set of memory cells to see if there is an improvement in the bit error rate.

4. The storage module of claim 3, wherein the controller is further configured to end the quarantine of the set of memory cells in response to determining that the bit error rate is below the threshold.

5. The storage module of claim 3, wherein the controller is further configured to continue the quarantine of the set of memory cells in response to determining that there is an improvement in the bit error rate but that the bit error rate is still not below the threshold.

6. The storage module of claim 3, wherein the controller is further configured to permanently quarantine the set of memory cells in response to determining that there is no improvement in the bit error rate.

7. The storage module of claim 1, wherein the set of memory cells is programmed with user data.

8. The storage module of claim 1, wherein the memory cells store multiple bits per cell, and wherein the set of memory cells are programmed such that all of the bits of the memory cell are in a programmed state.

9. The storage module of claim 1, wherein the period of time is dependent on a temperature in the storage module.

10. The storage module of claim 9, wherein the temperature is determined by a temperature sensor in the storage module, and wherein the period of time is measured by clock signal in the controller.

11. The storage module of claim 9, wherein the temperature and period of time are measured by a sentinel cell's voltage drift.

12. The storage module of claim 1, wherein the heat is generated by the storage module in its normal operation.

13. The storage module of claim 1, wherein the memory is a three-dimensional memory.

14. The storage module of claim 1, wherein the storage module is embedded in a host.

15. The storage module of claim 1, wherein the storage module is removably connected to a host.

16. The storage module of claim 1, wherein the storage module is a solid-state drive.

17. A method for using healing effects of a quarantine process, the method comprising:
performing the following in a storage module:
identifying a word line having a set of memory cells in the memory that contains a bit error rate above a threshold, wherein the bit error rate is above the threshold due to trapped charge in dielectrics of the memory cells;
programming the word line; and
after the word line has been programmed, quarantining the word line for a period of time, wherein while the word line is quarantined, heat generated by the storage module anneals the set of memory cells to at least partially remove the trapped charge;
wherein the word line is one of a plurality of word lines in a block of memory, and wherein the method further comprises continuing to use the other word lines in the block to store data while the word line is quarantined and programming dummy data in one or more word lines surrounding the quarantined word line.

18. The method of claim 17, wherein the word line is one of a plurality of word lines in a block of memory, and wherein the method further comprises continuing to use the other word lines in the block to store data while the word line is quarantined.

19. The method of claim 18 further comprising programming dummy data in one or more word lines surrounding the quarantined word line.

20. The method of claim 17, wherein the word line is one of a plurality of word lines in a block of memory, and wherein the method further comprises slowing a circulation of the block to allow enough time for heat generated by the storage module to anneal the set of memory cells to at least partially remove the trapped charge.

21. The method of claim 17 further comprising testing the set of memory cells to see if there is an improvement in the bit error rate.

22. The method of claim 21 further comprising ending the quarantine of the set of memory cells in response to determining that the bit error rate is below the threshold.

23. The method of claim 21 further comprising continuing the quarantine of the set of memory cells in response to determining that there is an improvement in the bit error rate but that the bit error rate is still not below the threshold.

24. The method of claim 21 further comprising permanently quarantining the set of memory cells in response to determining that there is no improvement in the bit error rate.

25. The method of claim 17, wherein the memory cells store multiple bits per cell, and wherein the set of memory cells are programmed such that all of the bits of the memory cell are in a programmed state.

26. The method of claim 17, wherein the period of time is dependent on a temperature in the storage module.

27. The method of claim 26, wherein the temperature is determined by a temperature sensor in the storage module, and wherein the period of time is measured by clock signal in the storage module.

28. The method of claim 26, wherein the temperature and period of time are measured by a sentinel cell's voltage drift.

29. The method of claim 17, wherein the heat is generated by the storage module in its normal operation.

30. The method of claim 17, wherein the memory is a three-dimensional memory.

31. The method of claim 17, wherein the storage module is embedded in a host.

32. The method of claim 17, wherein the storage module is removably connected to a host.

33. The method of claim 17, wherein the storage module is a solid-state drive.

* * * * *